United States Patent
Yeh et al.

(12)

(10) Patent No.: US 6,785,163 B2
(45) Date of Patent: Aug. 31, 2004

(54) TRIM CIRCUIT AND METHOD FOR TUNING A CURRENT LEVEL OF A REFERENCE CELL IN A FLASH MEMORY

(75) Inventors: Chih-Chieh Yeh, Hsinchu (TW); Tso-Hung Fan, Hsinchu (TW); Tao-Cheng Lu, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 5 days.

(21) Appl. No.: 10/387,501

(22) Filed: Mar. 14, 2003

(65) Prior Publication Data

US 2003/0179603 A1 Sep. 25, 2003

(30) Foreign Application Priority Data

Mar. 25, 2002 (TW) ........................................ 91105835 A

(51) Int. Cl.[7] .............................................. G11C 16/06
(52) U.S. Cl. .............................. 365/185.2; 365/185.18; 365/185.33; 365/189.09
(58) Field of Search .......................... 365/185.2, 185.18, 365/185.33, 189.09

(56) References Cited

U.S. PATENT DOCUMENTS 5,859,796 A * 1/1999 Cleveland ................ 365/185.2

* cited by examiner

Primary Examiner—Anh Phung
Assistant Examiner—Pho M. Luu
(74) Attorney, Agent, or Firm—Rabin & Berdo, P.C.

(57) ABSTRACT

A trim circuit and method for tuning a current level of a reference cell in a flash memory that includes a sense amplifier to compare a cell current from a memory cell whose gate receives a word line signal voltage with a reference current from the reference cell whose gate receives a bias voltage produced by dividing the word line signal voltage by a voltage divider to thereby produce a sense signal. The voltage divider includes at least a programmable flash cell to serve as a variable resistor whose resistance is determined by programming the programmable flash cell by a programming/erasing circuit in reference to the programming of the memory cell.

6 Claims, 7 Drawing Sheets

TRIM CIRCUIT AND METHOD FOR TUNING A CURRENT LEVEL OF A REFERENCE CELL IN A FLASH MEMORY

FIELD OF THE INVENTION

The present invention relates generally to a flash memory, and more particularly to a trim circuit and method for tuning a current level of a reference cell in a flash memory.

BACKGROUND OF THE INVENTION

During the operation of reading data out from a flash memory, the charge sensing thereof is of the most importance and by which the data read-out operation requires fast, accurate and reliable determination of the level of each selected memory cell under the direct connection of the memory cell to a sense amplifier. FIG. 1 shows a schematic diagram of reading out of data from a flash memory array, in which the memory cell 12 to be read is selected from the memory array and is connected to a sense amplifier 16 that is further connected with a reference cell or dummy cell 14 so as to compare the cell current from the memory cell 12 and the reference current from the reference cell 14 to thereby determine the sense signal at the output of the sense amplifier 16. Both the memory cell 12 and reference cell 14 are flash cells, and the sensing of data read-out is based on the threshold voltage $V_{t,Ref}$, where $V_{t,Ref}$ has a designed or predetermined level, of the reference cell 14 that is biased to conducts a current proportional to its threshold voltage $V_{t,Ref}$. During the tracking operation of this memory, the word line signal voltage $V_{WL}$ is applied to the gate of the memory cell 12 whose source is grounded and whose drain is accessed. In this mode, the memory cell 12 conducts a cell current $I_{Cell}$ proportional to its threshold voltage $V_{t,Cell}$, and in the reference cell 14 the word line signal voltage $V_{WL}$ is applied directly to the gate of the reference cell 14. Therefore, if the current $I_{Cell}$ flowing through the memory cell 12 is larger than the reference current $I_{Ref}$ of the reference cell 14, i.e., $I_{Cell} > I_{Ref}$, then the threshold voltage $V_{t,Cell}$ of the memory cell 12 can be determined smaller than the threshold voltage $V_{t,Ref}$ of the reference cell 14, i.e., $V_{t,Cell} < V_{t,Ref}$. Read-out of the data is accomplished by comparing the current $I_{Cell}$ flowing through the memory cell 12 with the current $I_{Ref}$ flowing through the reference cell 14, and these currents are sensed by connecting the drains of the memory cell 12 and reference cell 14 to an active load, such as the differential amplifier 16 shown in FIG. 1. If it is determined $I_{Cell} > I_{Ref}$, the sense amplifier 16 outputs logic 1, otherwise it outputs logic 0. The sensing operation for data read-out described herewith is also employed in the programming operation of the memory. During the operation of programming, sensing is used to verify if the memory cell 12 has been programmed to the desired level. FIG. 2 shows an alternative circuit, which is based on the same principle and operation as in FIG. 1, only that the reference cell 18 is a MOS transistor, instead of a flash cell, and the word line signal voltage $V_{WL}$ is modified by a gate coupling ratio (GCR) before it is applied to the gate of the reference cell 18. FIG. 3 further shows a circuit to generate the GCR for the reference cell 20 by dividing the word line signal voltage $V_{WL}$ by a voltage divider 202 to produce a proper bias voltage to the MOS transistor 201 of the reference cell 20.

In a flash memory, a stable reference cell and thereby the reference current thereof are desired to assure that the memory cell is programmed to the desired level during the programming procedure and the level of the memory cell is accurately sensed and determined during the reading procedure. However, the operation of the memory circuit and the manufacturing process of the memory circuit may result in current variations. For example, power supply disturbance can cause voltage variation and consequently the current level variation of the reference cell is occurred, and manufacturing process variation can cause the size of the reference cell or the GCR of the memory cell changed and, as a result, the designed current level of the reference cell drifting or changed to the extent that the circuit does not work. Therefore, a tuning circuit is necessary to adjust the current level of the reference cell in the chip testing phase. Nevertheless neither of the circuits shown in FIG. 1 and FIG. 2 has the ability to dynamically and accurately adjust the current level of the reference cell. FIG. 4 shows an improved circuit that introduces a resistor network 223 into its reference cell 22 to connect the voltage divider 222 for biasing the MOS transistor 221. The resistor network 223 includes a plurality of resistors connected in series and parallel, and each of the resistors is controlled by the flash cell connected in series with it to determine whether it is connected to the other elements and thus is effective to the circuit. For instance, resistor 224 is controlled by the flash cell 225, and the latter serves as a switch to determine if the resistor 224 is connected to the voltage divider 222. Those flash cells in the resistor network 223 are programmed by a programming circuit 24, and they can be only programmed to one of the high and low states to be an open or short circuit. Even though this method can adjust the GCR of the MOS transistor 221, the resistor network 223 consumes a lot of chip area and makes the circuit quite complicated. Moreover, it can only adjust the equivalent resistance of the resistor network 223 from some specific values, instead in a continuous range. Therefore, further improvement on the circuit and method for tuning the current level of the reference cell in flash memory is desired.

SUMMARY OF THE INVENTION

One object of the present invention is to provide a trim circuit and method for tuning the current level of a reference cell in a flash memory by means of a voltage divider added to the reference cell to adjust the GCR of the reference cell. Particularly, the voltage divider includes a first and second voltage dividing units, and at least one of the units includes a programmable flash cell to serve as a variable resistor whose resistance is controlled by programming the flash cell to the desired level.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
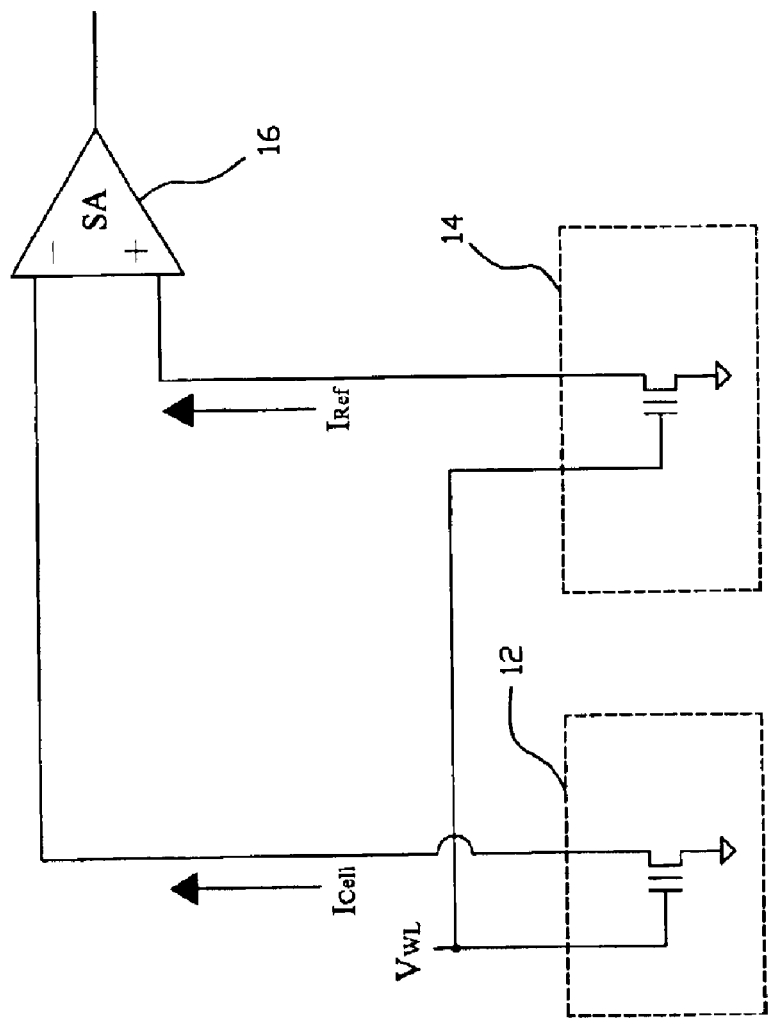
FIG. 1 is the schematic diagram to illustrate the data read-out operation in a conventional flash memory.
Figure 2:
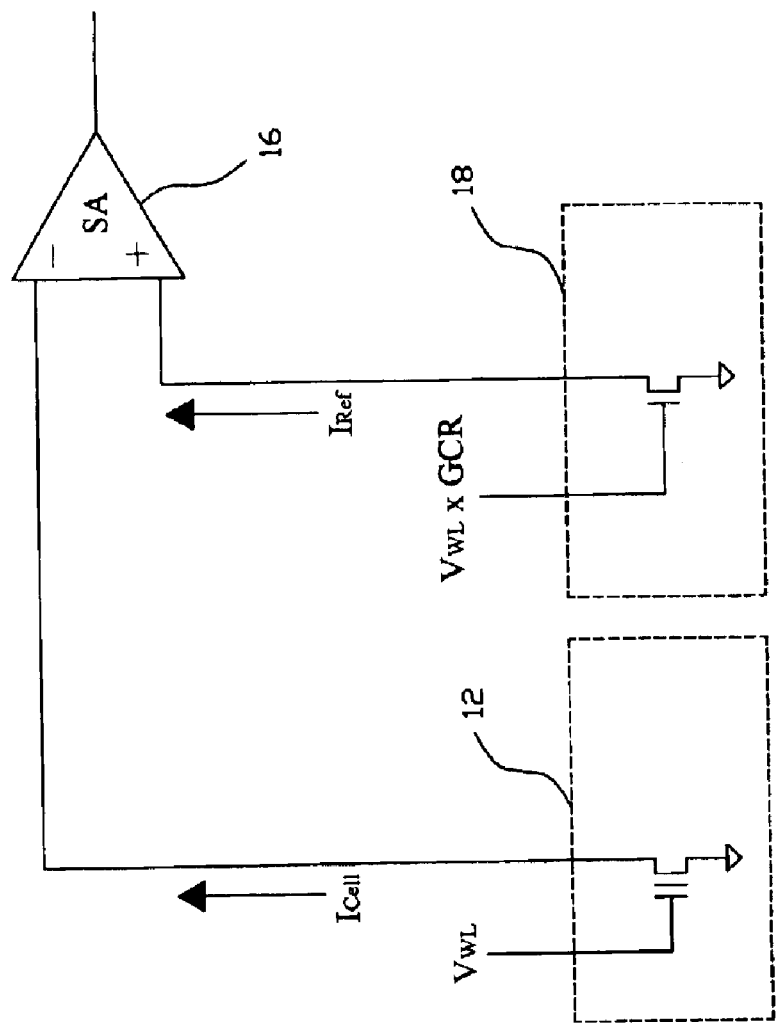
FIG. 2 is the schematic diagram to illustrate the data read-out operation in another conventional flash memory.
Figure 3:
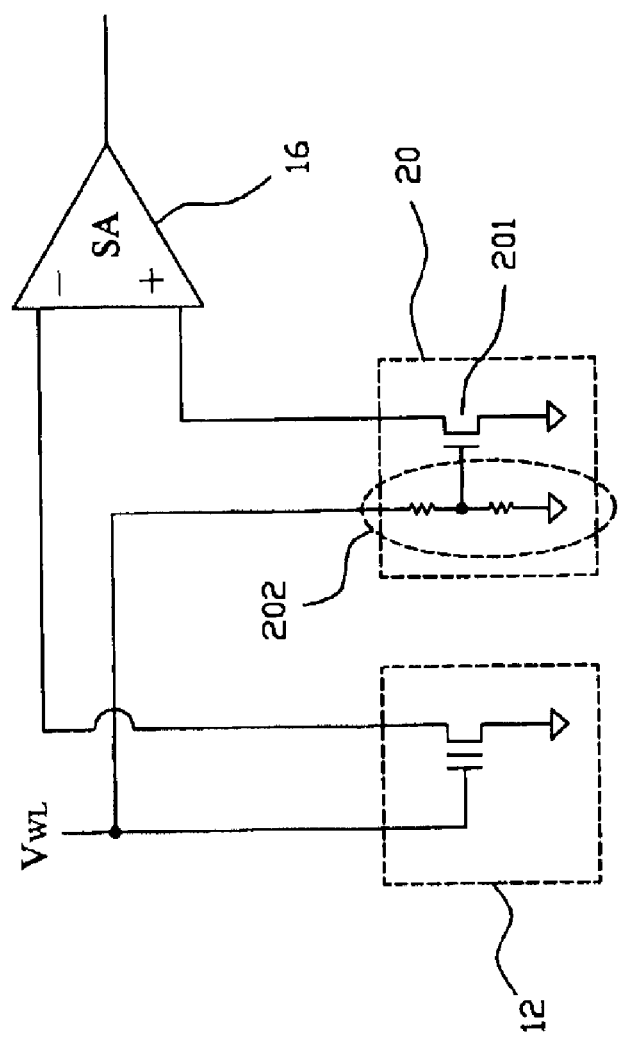
FIG. 3 shows the conventional circuit to generate the GCR for the circuit shown in FIG. 2.
Figure 4:
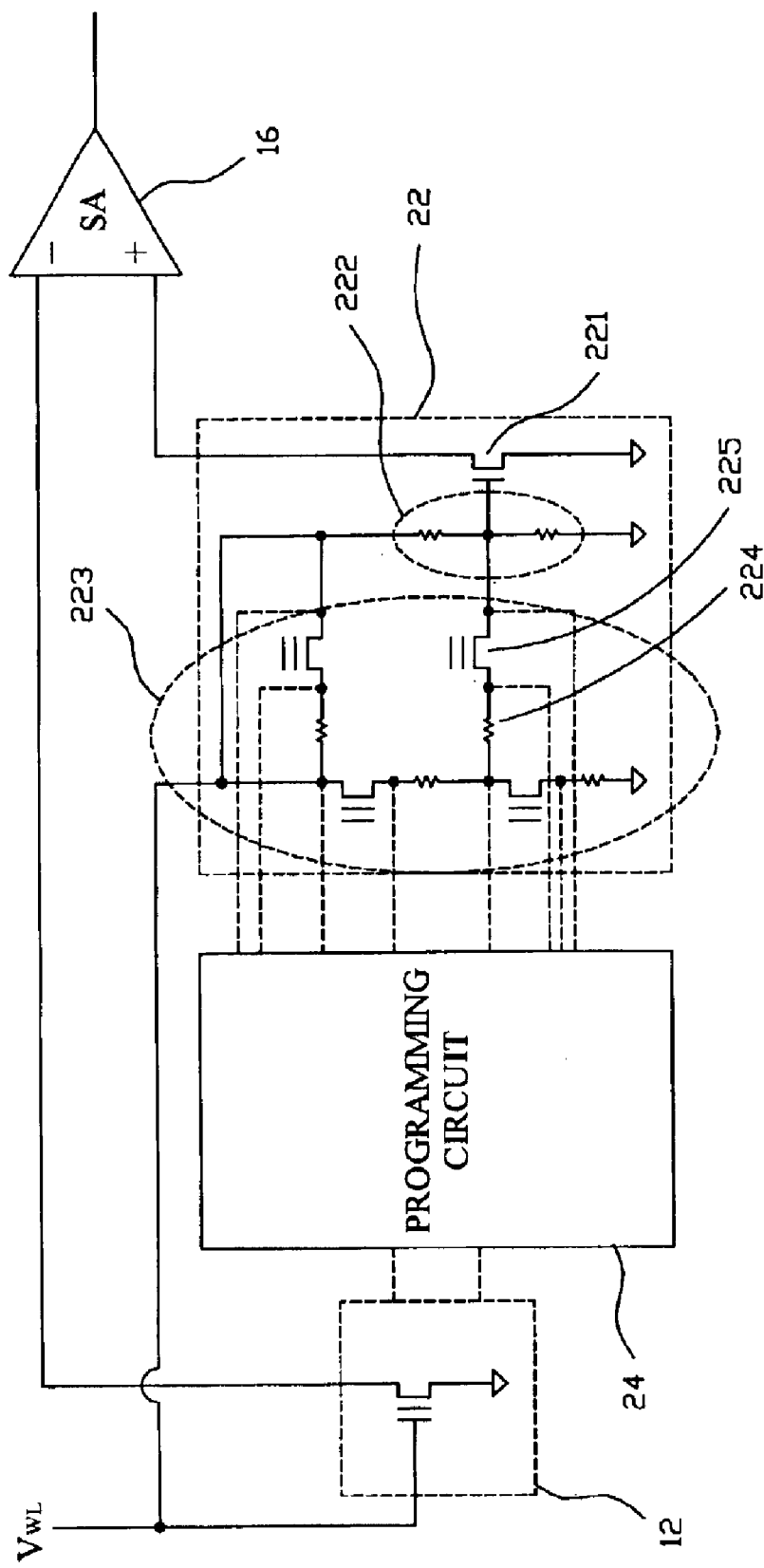
FIG. 4 shows a conventional circuit to adjust the GCR of the reference cell in a flash memory.
Figure 5:
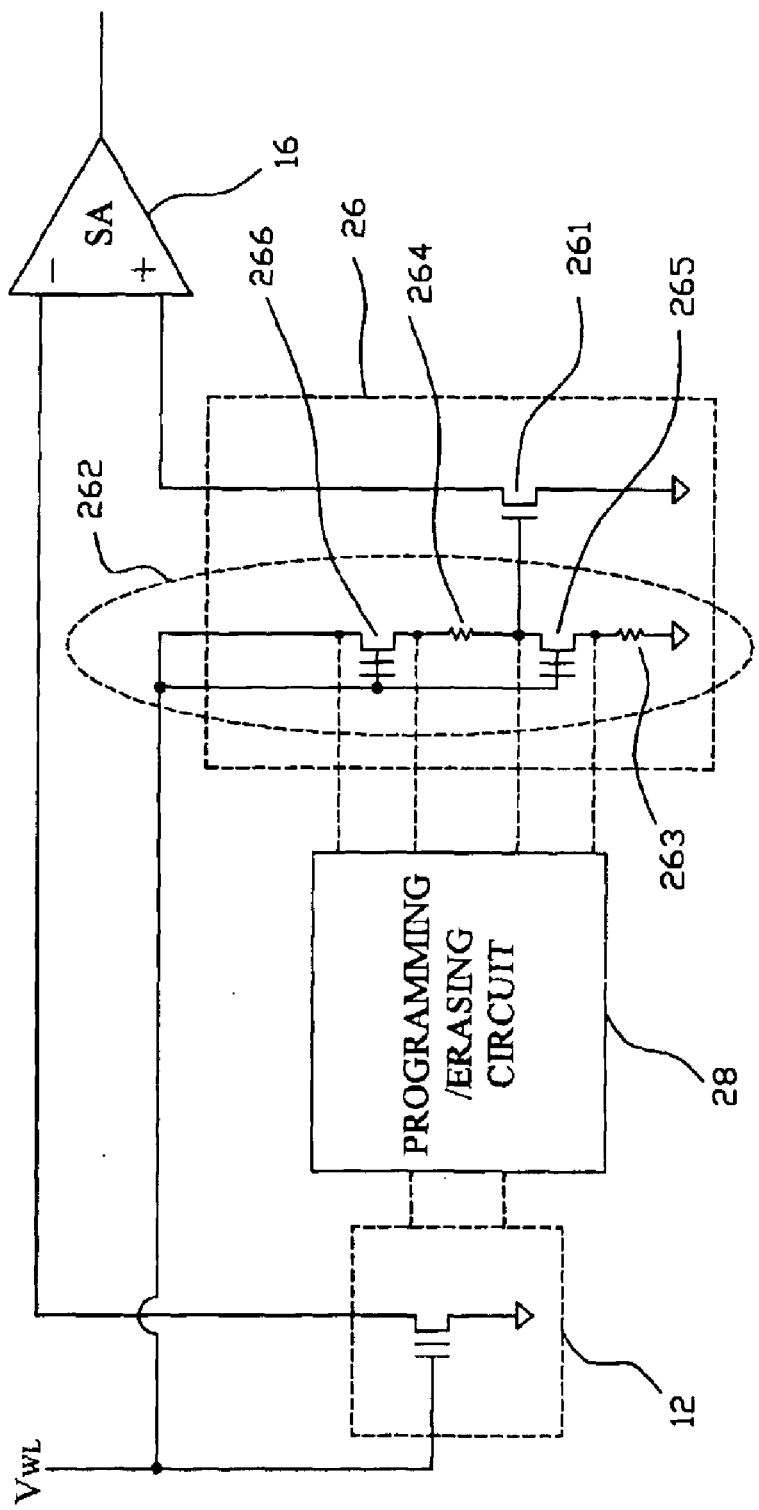
FIG. 5 is the first embodiment according to the present invention.

FIG. 5 shows the first embodiment of the present invention. Similarly, the memory cell 12 and reference cell 26 are connected to the sense amplifier 16, and the MOS transistor 261 in the reference cell 26 has its source grounded, its drain to provide the reference current, and its gate biased by a bias voltage that is provided by dividing the word line signal voltage $V_{WL}$ by a voltage divider 262. The voltage divider 262 includes resistors 263 and 264 as well as flash cells 265 and 266 connected in series, and those two flash cells 265 and 266 are configured as resistors, i.e., their gates are connected together to the word line signal voltage $V_{WL}$, and their resistances are determined by their programming. In other words, the flash cells 265 and 266 serve as variable resistors instead of switches. In particular, the resistor 263 and flash cell 265 form a unit to determine an equivalent resistance and the resistor 264 and flash cell 266 form another unit to determine a second equivalent resistance, and these two units construct the voltage divider 262 by their equivalent resistances connected in series. A programming/erasing circuit 28 is connected to the memory cell 12 as well as to the programmable flash cells 265 and 266 in the voltage divider 262 to program the flash cell variable resistors 265 and 266 to reach the desired level in reference to the characteristics of the flash memory cell 12, and in turn accurately determines the GCR of the reference cell 26. The method for such programming can be performed for example by utilizing increment pulse control, and can be performed concurrently with the programming of the flash memory cell 12. When this circuit is operated in tracking mode, the flash cell variable resistors 265 and 266 are normally open, and their resistances in combination of those of the resistors 263 and 264 determine the GCR. When the variations due to process or circuit drift result in the reference current malfunction, the flash cells 265 and 266 can be programmed to the desired threshold voltage to adjust their resistances as of variable resistors, such that the GCR can be adjusted to the desired level by such tuning of the flash cells 265 and 266. In addition to the programming circuit, an erasing circuit is further included in the circuit 28 to erase the flash cells 265 and 266 if any programming errors occurred. Moreover, user himself can determine the reference current to be the desired level by the programming/erasing circuit 28 under the operation mode of the memory chip.

Figure 6:
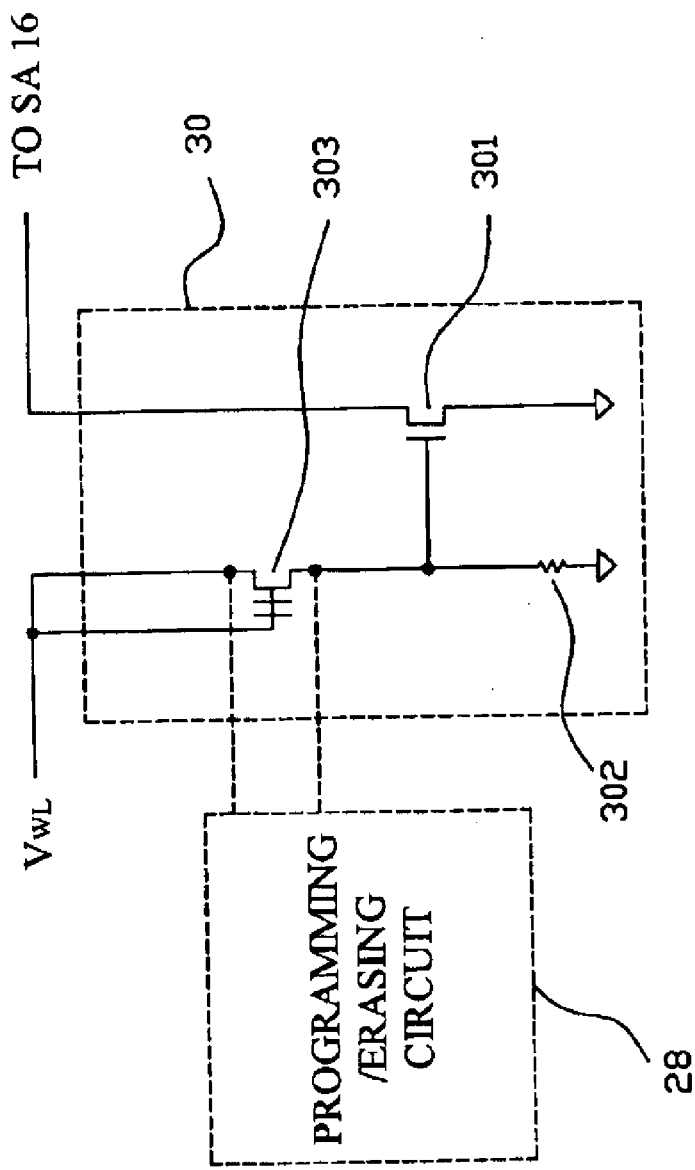
FIG. 6 is the second embodiment according to the present invention.
Figure 7:
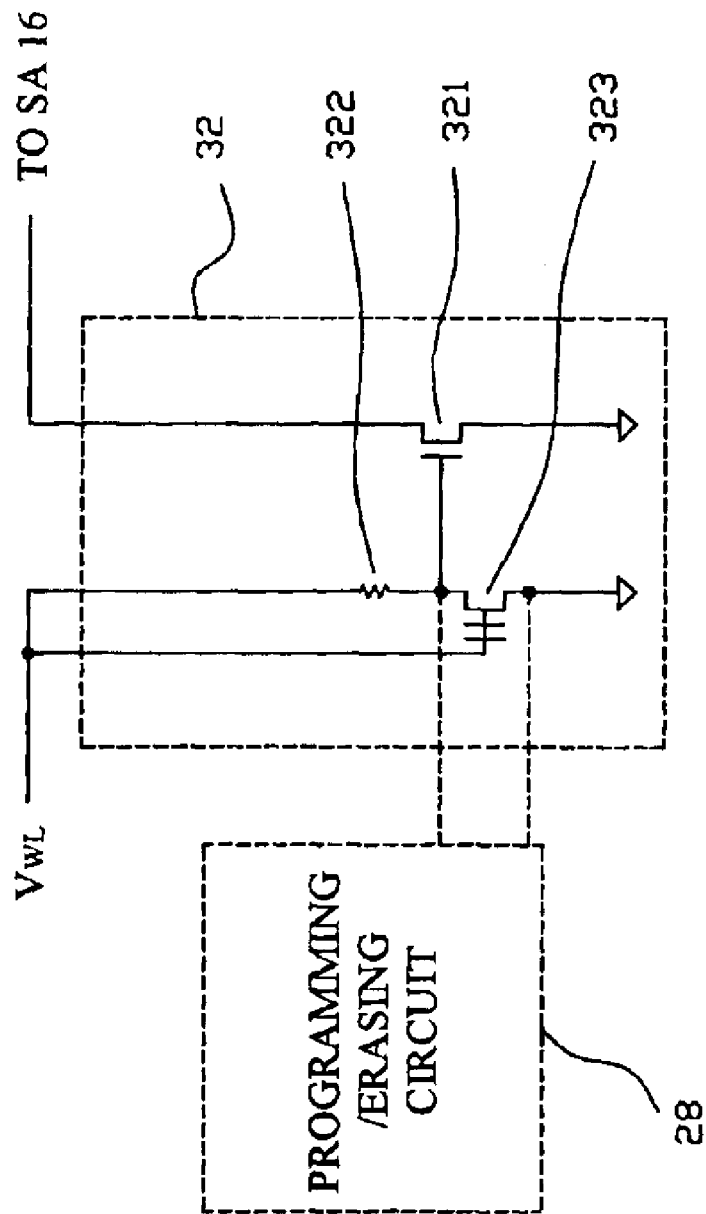
FIG. 7 is the third embodiment according to the present invention.

Two variations of the voltage divider are shown in FIG. 6 and FIG. 7, respectively. In FIG. 6, the bias circuit to generate the GCR for the reference cell 30 is further simplified as the gate of the MOS 301 connected to ground through a resistor 302 and the word line signal voltage $V_{WL}$ connected to the gate of the MOS 301 through a flash cell 303 and the gate of the flash cell 303. Likewise, the programming/erasing circuit 28 controls the programming of the flash cell 303 to the desired level to provide the proper resistance and in turn to determine the voltage dividing ratio and thus the GCR for the reference cell 30. Now the voltage divider in the reference cell 30 is simplified and constructed by the resistor 302 and the variable resistor of the flash cell 303 connected in series. The situation is similar in FIG. 7, the gate of MOS 321 in reference cell 32 is connected to the word line signal voltage $V_{WL}$ through a resistor 322 and to ground through a flash cell 323 whose gate is also connected to the word line signal voltage $V_{WL}$. Now that the programming/erasing circuit 28 controls the programming of the flash cell 323 to the desired level to provide the proper resistance, and thus the voltage dividing ratio and the GCR for the reference cell 30 are determined.

In particular, the principle incorporated in the present invention is different from that of conventional circuitry. The flash cell in the voltage divider of the invented circuit serves as a variable resistor instead of a switch and, therefore, the way of its connection and operation are different from those in conventional circuitry. As a result, it eliminates the need for many resistors to form a resistor network in the circuit, and it further simplifies the circuit and reduces the chip area. Also, by employing the programmable flash cell as a variable resistor, the GCR is continuously tunable and has a wider tunable range, thus precise control for the GCR is achieved. The circuit and method according to the present invention enables the GCR of the reference cell be tuned during the test procedure of the memory chip, so that there is no need for complicated circuit, the number of necessary components is reduced, and very small chip area is occupied. Moreover, the threshold voltage of the flash cell programmed as a variable resistor can be programmed to an accurate level, its programming error can be prevented by the erasing circuit, and the user himself can use the programming/erasing circuit to control the reference cell to the desired level.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A trim circuit for tuning a current level of a reference cell in a flash memory including a sense amplifier for comparing a cell current from a memory cell having a gate for receiving a word line signal voltage with a reference current from the reference cell having a gate for receiving a bias voltage to produce a sense signal, the trim circuit comprising:
   a first and second units connected in series for producing the bias voltage by dividing the word line signal voltage with at least one of the first and second units having a programmable flash cell to serve as a variable resistor having a programmable resistance; and
   a programming circuit connected to the memory cell and flash cell for programming the programmable flash cell to thereby determine a value of the programmable resistance.

2. The trim circuit of claim 1, further comprising an erasing circuit for erasing the programmable flash cell.

3. The trim circuit of claim 1, wherein the programming circuit programs the programmable flash cell to a level in reference to a programming of the memory cell.

4. A trim method for tuning a current level of a reference cell in a flash memory including a sense amplifier for comparing a cell current from a memory cell having a gate for receiving a word line signal voltage with a reference current from the reference cell having a gate for receiving a bias voltage to produce a sense signal, the trim method comprising the steps of:
   programming a programmable flash cell to thereby determine a resistance thereof;
   connecting the programmable flash cell to a resistor in series to thereby form a voltage divider; and
   dividing the word line signal voltage by the voltage divider to thereby produce the bias voltage.

5. The trim method of claim 4, further comprising the step of erasing the programmable flash cell.

6. The trim method of claim 4, wherein the programmable flash cell is programmed in reference to a programming of the memory cell.

* * * * *